(12) United States Patent
Shigematsu

(10) Patent No.: US 7,782,140 B2
(45) Date of Patent: Aug. 24, 2010

(54) ANALOG CIRCUIT

(75) Inventor: Hisao Shigematsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/234,105

(22) Filed: Sep. 19, 2008

(65) Prior Publication Data
US 2009/0009253 A1    Jan. 8, 2009

Related U.S. Application Data

(63) Continuation of application No. PCT/JP2006/305595, filed on Mar. 20, 2006.

(51) Int. Cl.
H03F 3/60 (2006.01)
(52) U.S. Cl. .................. 330/286; 330/54
(58) Field of Classification Search .......... 330/286, 330/54, 295, 84, 126
See application file for complete search history.

(56) References Cited

U.S. PATENT DOCUMENTS

| | | | | |
|---|---|---|---|---|
| 2,957,143 | A * | 10/1960 | Enloe | 330/306 |
| 3,218,573 | A | 11/1965 | Van Kessel | |
| 3,222,611 | A * | 12/1965 | Norton, Jr. | 330/54 |
| 3,486,126 | A | 12/1969 | Chin et al. | |
| 4,291,286 | A * | 9/1981 | Wagner | 333/166 |
| 4,498,058 | A | 2/1985 | Benrud | |
| 4,535,301 | A | 8/1985 | Takayama | |
| 4,835,485 | A | 5/1989 | Mueller | |
| 5,010,305 | A | 4/1991 | Shiga | |
| 5,021,743 | A * | 6/1991 | Chu et al. | 330/54 |
| 5,227,734 | A | 7/1993 | Schindler et al. | |
| 5,248,948 | A | 9/1993 | Shiga | |
| 6,124,767 | A | 9/2000 | Woods | |
| 6,864,750 | B2 * | 3/2005 | Shigematsu | 330/311 |
| 6,924,697 | B2 * | 8/2005 | Hill | 330/140 |

FOREIGN PATENT DOCUMENTS

| | | |
|---|---|---|
| EP | 0 374 744 A2 | 12/1989 |
| EP | 0 374 744 A2 | 6/1990 |
| EP | 0 647 025 A1 | 4/1995 |
| EP | 1 909 387 A1 | 4/2008 |
| JP | 60-190005 A | 9/1985 |
| JP | 63-50204 A | 3/1988 |
| JP | 1-137705 A | 5/1989 |
| JP | 2-170602 A | 7/1990 |

(Continued)

Primary Examiner—Henry K Choe
(74) Attorney, Agent, or Firm—Arent Fox LLP

(57) ABSTRACT

A resistor (9-1) and a resistor (11-1) are connected in parallel with each other between a source of an input transistor (7-1) and the ground. A switch (12-1) is provided between the resistor (11-1) and the source. A variable resistor circuit may be constituted by the resistor (9-1), the resistor (11-1) and the switch (12-1). Further, a capacitor (10-1) and a variable capacitor (13-1) are connected in series with each other between the source and the ground. A control terminal (14-1) to which a voltage is applied when capacitance of the variable capacitor (13-1) is controlled is provided between the capacitor (10-1) and the variable capacitor (13-1). A variable capacitor circuit may be constituted by the capacitor (10-1) and the variable capacitor (13-1). An input capacitance change circuit may be constituted by the variable resistor circuit and the variable capacitor circuit.

16 Claims, 15 Drawing Sheets

FOREIGN PATENT DOCUMENTS

| | | |
|---|---|---|
| JP | 02-301205 A | 12/1990 |
| JP | 05-136641 A | 6/1993 |
| JP | 05-251962 A | 9/1993 |
| JP | 07-176986 A | 7/1995 |
| JP | 07-273551 A | 10/1995 |
| JP | 11-261348 A | 9/1999 |
| JP | 2001-284993 A | 10/2001 |
| JP | 2004-266316 A | 9/2004 |

* cited by examiner

PRIOR ART

ANALOG CIRCUIT

CROSS-REFERENCE TO RELATED APPLICATIONS

This application is a Continuation of International Application No. PCT/JP2006/305595, with an international filing date of Mar. 20, 2006, which designating the United States of America, the entire contents of which are incorporated herein by reference.

FIELD

The present invention relates to an analog circuit including a transistor.

BACKGROUND

In recent years, a demand for a communication system capable of transmitting/receiving massive data in high-speed (for example, 40 Gb/s) increases resulting from a rapid popularization of Internet. Besides, a high-gain and broadband amplifier having a band of 40 GHz or more is required as an amplifier used for the communication system as stated above. The amplifiers as stated above are used for a driver circuit driving an LN (LiNbO$_3$) modulator disposed at a front end of a transmission part, a pre-amplifier and an equivalent amplifying portion disposed at a front end of a receiving part, and so on.

Besides, a distributed amplifier can be cited as an amplifier suitable for the use as stated above. Input transistors such as a bipolar junction transistor (BJT) and a field-effect transistor (FET) are included in the distributed amplifier, and the band thereof is determined by a ladder filter constituted by input capacitance of the input transistor and inductance of wiring. Accordingly, the distributed transistor has been used from long ago as an amplifying circuit suitable for the broad band. The distributed amplifier is known as an amplifier capable of bringing out performance of a transistor.

FIG. 11 is a circuit diagram showing a configuration of a conventional distributed amplifier. In the conventional distributed amplifier, n-pieces of unit cells are provided between an input terminal 101 and an output terminal 102. A resistor 105 constituting a terminator is connected to the other end of an input transmission line connected to the input terminal 10, and a resistor 106 constituting another terminator is connected to the other end of an output transmission line connected to the output terminal 102. Input transistors 107-1 to 107-n are connected between the input transmission line and the output transmission line by each unit cell. Gates of the input transistors 107-1 to 107-n are connected to the input transmission line, drains thereof are connected to the output transmission line, and sources thereof are grounded. Besides, two inductors 103 exist on the input transmission line by each unit cell, and two inductors 104 exist on the output transmission line by each unit cell.

A cut-off frequency of the distributed amplifier constituted as stated above is represented by "$1/\pi\sqrt{(LC_{in})}$". Here, "L" is a doubled value of inductance of the respective inductors 103 and 104, and "$C_{in}$" is the input capacitance of each input transistor.

However, in this conventional distributed amplifier, a loss of a pseudo transmission line constituted by the inductors 103 constituting the input transmission line and the input capacitances of the input transistors 107-1 to 107-n increases as the input capacitance $C_{in}$ becomes large, and there is a problem that a frequency characteristic is declining as shown in FIG. 12. Namely, a gain slope appears. In an optical communication, the declining frequency characteristic as stated above (gain slope) incurs deterioration of an output waveform because various frequency components are included in an input signal.

Here, causes why the gain slope appears are described with reference to FIG. 13A and FIG. 13B. FIG. 13A is an equivalent circuit diagram at the input transmission line side of each input transistor, and FIG. 13B is an equivalent circuit diagram at the output transmission line side of each input transistor.

At the input transmission line side (gate side), an attenuation constant $\alpha_g$ of the input signal is represented by a next expression (numerical expression 1). Here, "$\omega$" is a frequency of the input signal, "$R_g$" is a gate resistance of the input transistor, "$Z_0$" is $\sqrt{(L/C)}$, and "C" is a capacitance subsidiary to the two inductors 103 in each unit cell.

$$\alpha_g=\omega^2 C_{in}^2 R_g Z_0/2 \quad \text{[numerical expression 1]}$$

Consequently, the attenuation constant $\alpha_g$ depends on the frequency.

On the other hand, at the output transmission line side (drain side), an attenuation constant ad of an output signal is represented by a next expression (numerical expression 2). Here, "$R_{ds}$" is a resistance between a source and a drain of the input transistor.

$$\alpha_d=R_{ds} Z_0/2 \quad \text{[numerical expression 2]}$$

Consequently, the attenuation constant ad does not depend on the frequency.

It can be said that the causes of the gain slope exist at the input transmission line from the above. Consequently, it is effective for a suppression of the gain slope to reduce the attenuation constant $\alpha_g$.

Conventionally, a Capacitive Source Degeneration circuit as shown in FIG. 14 is used as a circuit capable of reducing the attenuation constant $\alpha_g$. In this Capacitive Source Degeneration circuit, resistors 109-1 to 109-n and capacitors 110-1 to 110-n are connected in parallel between sources of the respective input transistors 107-1 to 107-n and the ground.

FIG. 15 is a view showing a principle of the Capacitive Source Degeneration circuit. In the Capacitive Source Degeneration circuit, a source voltage of the input transistor is represented by a next expression (numerical expression 3). Here, "$V_{gs}$" is a voltage between the gate and the source, and "$g_m$" is a mutual conductance, "$R_s$" is a resistance value of each of the resistors 109-1 to 109-n, and "$C_s$" is capacitance of each of the capacitors 110-1 to 110-n.

$$V_s = V_{gs}(g_m R_s - j\omega(C_s R_s g_m - C_{in}) R_s) \quad \text{[numerical expression 3]}$$

If "$C_s R_s g_m - C_{in}=0$" is achieved, an input admittance $Y_{11}$ is represented by a next expression (numerical expression 4).

$$Y_{11}=\omega^2 C_{in}^2 R_g/(1+g_m R_s)^2 + j\omega C_{in}/(1+g_m R_s) \quad \text{[numerical expression 4]}$$

On the other hand, an input admittance $Y_{11}'$ in the conventional circuit shown in FIG. 10 is represented by a next expression (numerical expression 5).

$$Y'_{11}=\omega^2 C_{in}^2 R_g + j\omega C_{in} \quad \text{[numerical expression 5]}$$

The numerical expressions 4 and 5 show that it is possible to reduce the input capacitance $C_{in}$ up to $1+g_m R_s$ times when the Capacitive Source Degeneration circuit is used compared to a case when the Capacitive Source Degeneration circuit is not used.

However, when the Capacitive Source Degeneration circuit is used, there is a problem in which variation occurs in the characteristic of the distributed amplifier itself, and a yield may decrease.

SUMMARY

An input transistor and an input capacitance change circuit changing input capacitance of the input transistor are provided in a first analog circuit according to the present invention. This circuit functions as a distributed amplifier.

An oscillation transistor and a negative resistance change circuit changing negative resistance for the oscillation transistor are provided in a second analog circuit according to the present invention.

Additional objects and advantages of the embodiment will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENTS

Hereinafter, embodiments of the present invention are concretely described with reference to the attached drawings.

First Embodiment

Figure 1:
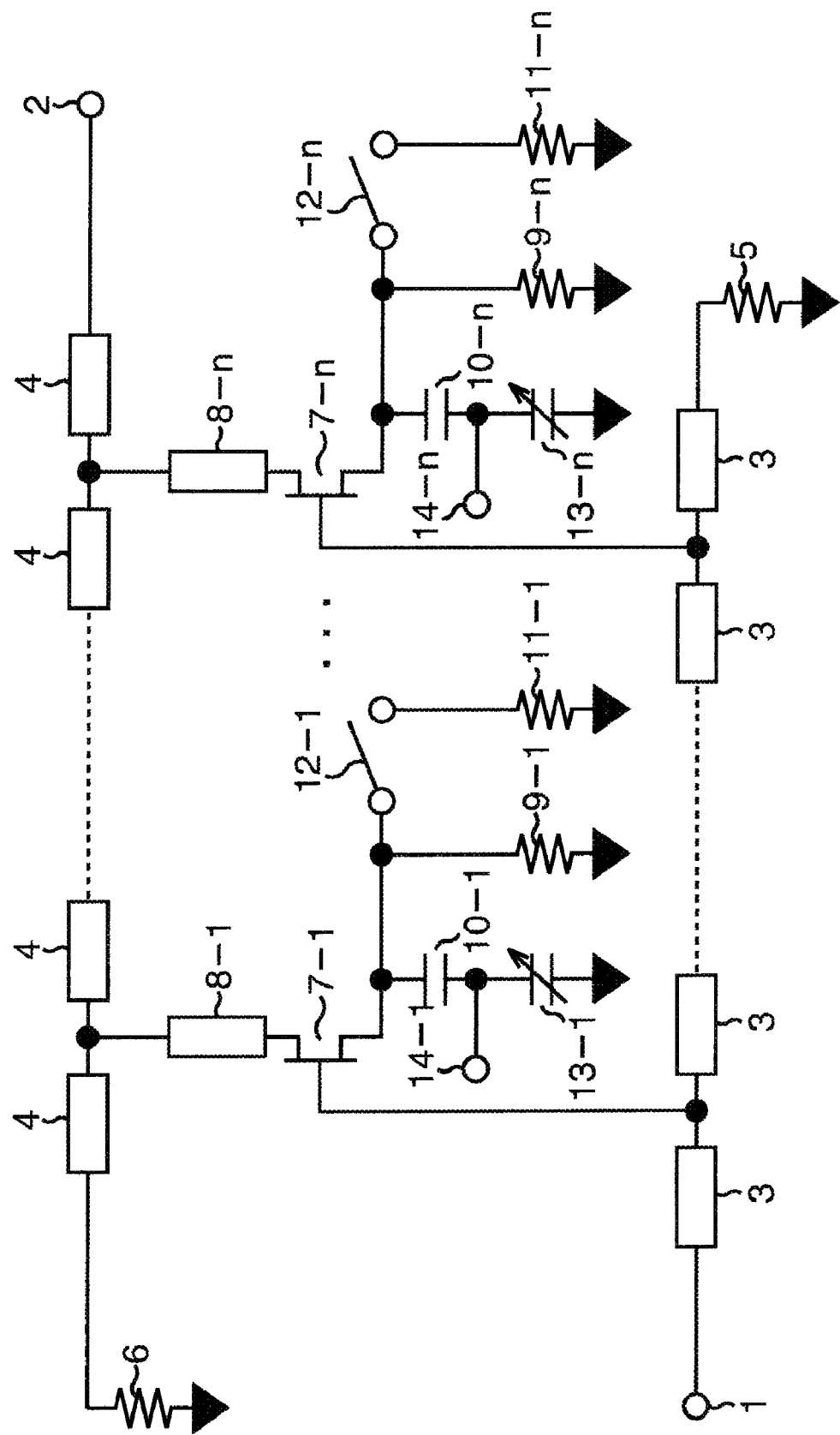
FIG. 1 is a circuit diagram showing a distributed amplifier according to a first embodiment of the present invention.

At first, a first embodiment of the present invention is described. FIG. 1 is a circuit diagram showing a distributed amplifier according to the first embodiment of the present invention.

In the distributed amplifier according to the first embodiment, n-pieces of unit cells are provided between an input terminal 1 and an output terminal 2. A resistor 5 constituting a terminator is connected to the other end of an input transmission line connected to the input terminal 1, and a resistor 6 constituting another terminator is connected to the other end of an output transmission line connected to the output terminal 2. Input transistors 7-1 to 7-$n$ are connected between the input transmission line and the output transmission line by each unit cell. Gates of the input transistors 7-1 to 7-$n$ are connected to the input transmission line, and drains thereof are connected to the output transmission line. Inductors 8-1 to 8-$n$ exist between the drains and the output transmission line. Besides, two inductors 3 exist on the input transmission line by each unit cell, and two inductors 4 exist on the output transmission line by each unit cell.

Besides, resistors 9-1 to 9-$n$ and resistors 11-1 to 11-$n$ are connected in parallel with each other between sources of the input transistors 7-1 to 7-$n$ and the ground. Switches 12-1 to 12-$n$ are provided between the resistors 11-1 to 11-$n$ and the sources. Variable resistor circuits may be constituted by the resistors 9-1 to 9-$n$, the resistors 11-1 to 11-$n$, and the switches 12-1 to 12-$n$. Further, capacitors 10-1 to 10-$n$ and variable capacitors 13-1 to 13-$n$ are connected in series with each other between the sources and the ground. Control terminals 14-1 to 14-$n$ to which voltage is applied when capacitances of the variable capacitors 13-1 to 13-$n$ are controlled are provided between the capacitors 10-1 to 10-$n$ and the variable capacitors 13-1 to 13-$n$. The voltage applied to the control terminals 14-1 to 14-$n$ may be selected from plural kinds set in advance. Variable capacitor circuits may be constituted by the capacitors 10-1 to 10-$n$ and the variable capacitors 13-1 to 13-$n$. In the present embodiment, input capacitance change circuits may be constituted by the variable resistor circuits and the variable capacitance circuits.

In the distributed amplifier having the constitution as stated above, for example, a frequency characteristic is measured after the switches 12-1 to 12-$n$ are turned off and a constant voltage is applied to the control terminals 14-1 to 14-$n$ after it is manufactured. Then, when a gain slope is occurred, all or a part of the switches 12-1 to 12-$n$ are turned on, or all or a part of voltage values applied to the control terminals 14-1 to 14-$n$ are switched to another value so that the above-stated expression "$C_sR_s=C_{in}/g_m$" becomes achieved. Namely, when the "$C_{in}$" and/or "$g_m$" vary/varies from a designed value resulting from manufacturing environment and so on, values of the "$C_s$" and/or "$R_s$" are changed so as to compensate the variation. Consequently, it is possible to obtain a state in which the above-stated expression "$C_sR_s=C_{in}/g_m$" is achieved even if the "$C_{in}$" and/or "$g_m$" vary/varies. Accordingly, it is possible to reduce input capacitance and suppress the gain slope while suppressing deterioration of yield in accordance with variation of characteristics.

Figure 2:
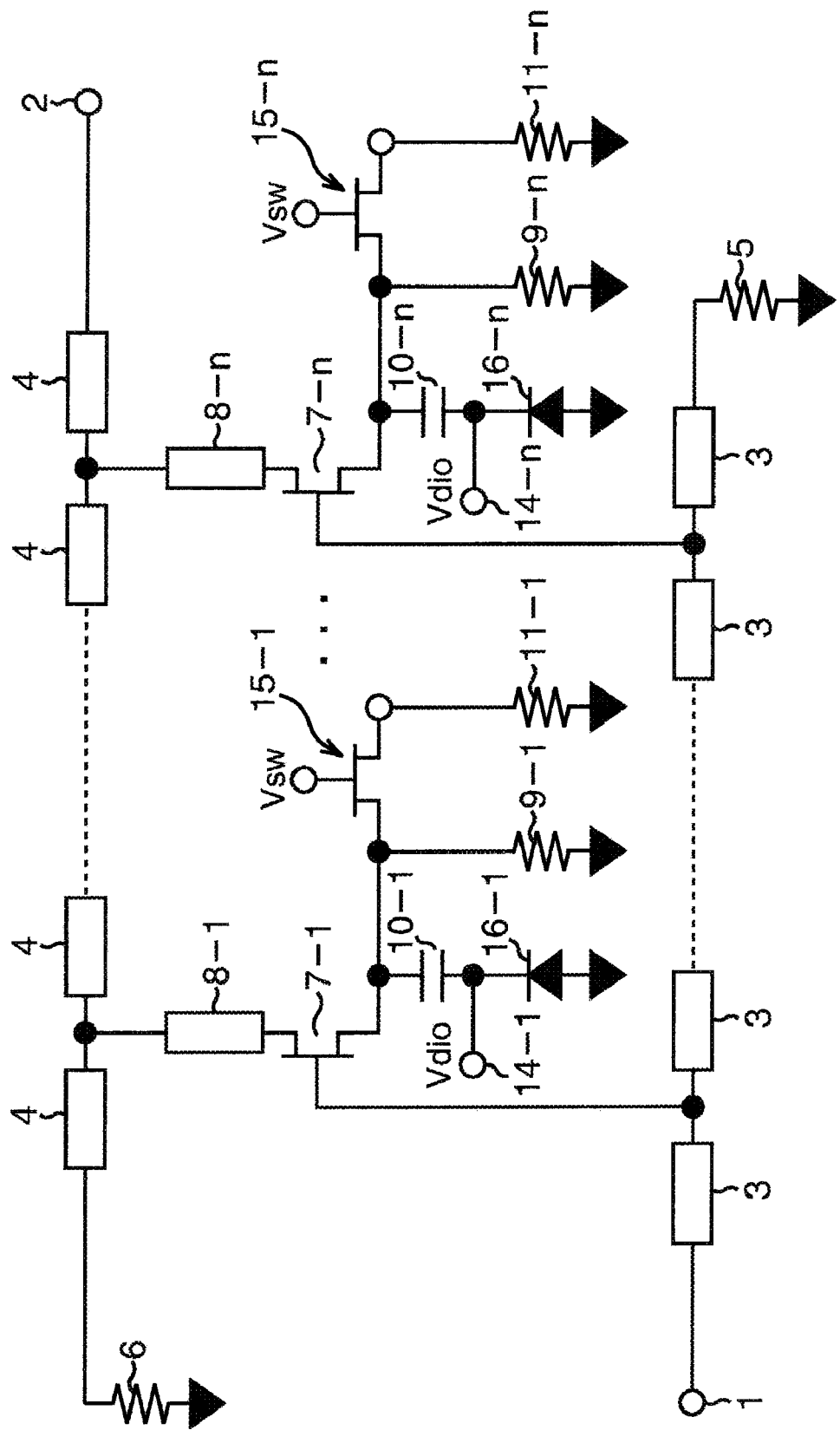
FIG. 2 is a circuit diagram concretely showing the circuit shown in FIG. 1.

Here, two kinds of simulations performed by the present inventor are described. In a first simulation, transistors 15-1 to 15-*n* which were turned on/off by switching a gate voltage Vsw were used as the switches 12-1 to 12-*n* as shown in FIG. 2. Besides, variable capacitance diodes 16-1 to 16-*n* were used as the variable capacitors 13-1 to 13-*n*. Further, a voltage Vdio of −2 V or 1 V was applied to the control terminals 14-1 to 14-*n*. Besides, the number of steps of the unit cells was eight.

Figure 3A:
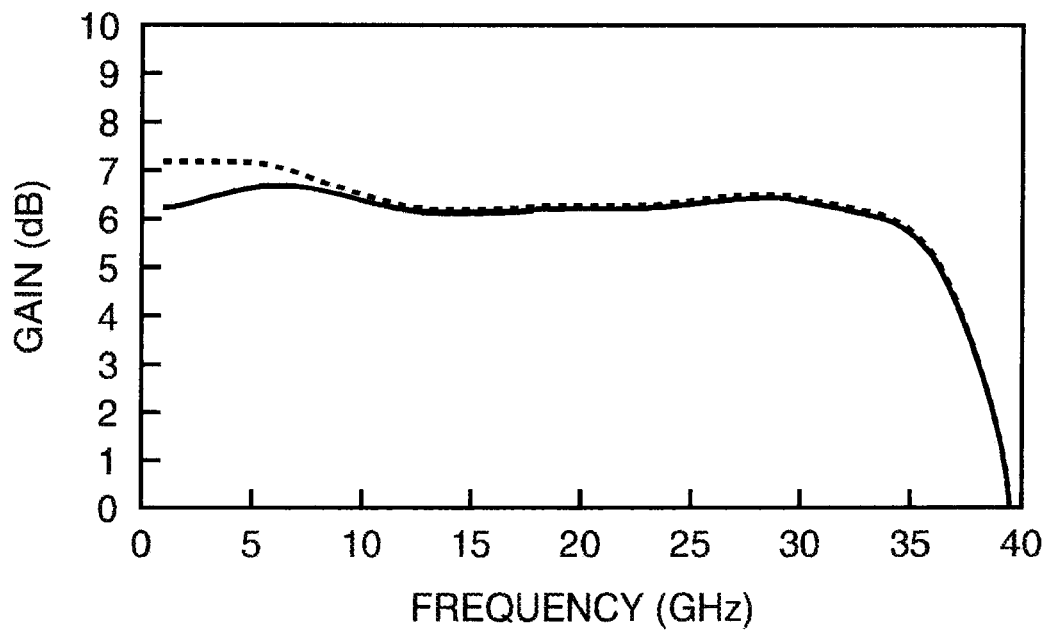
FIG. 3A is a graphic chart showing a relation between frequency and gain in a first simulation.
Figure 3B:
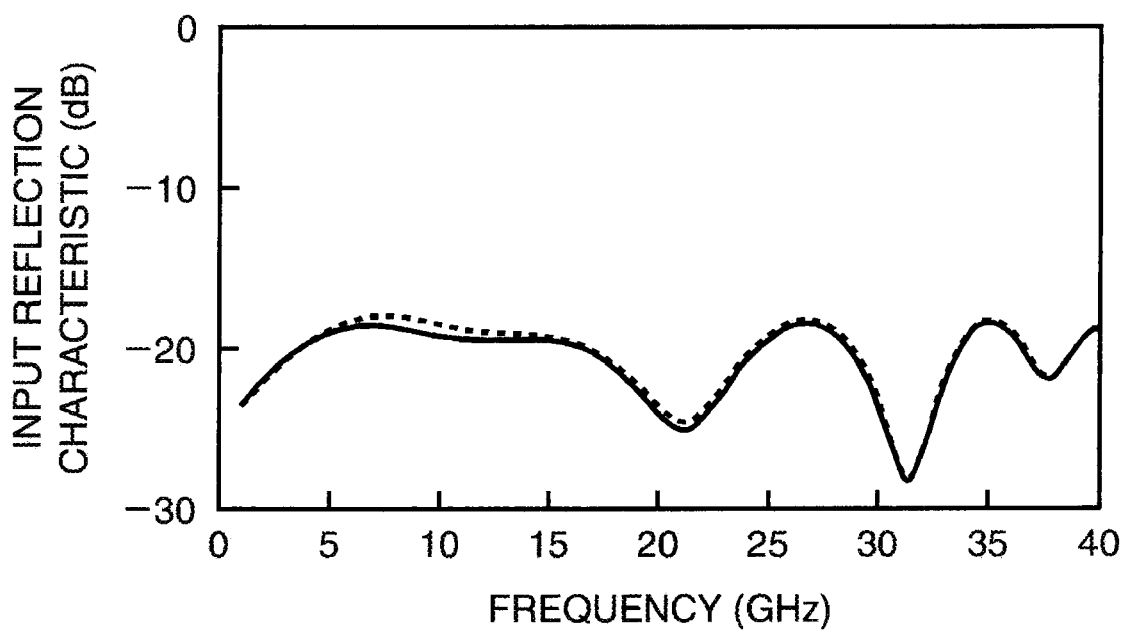
FIG. 3B is a graphic chart showing a relation between frequency and input reflection characteristic in the first simulation.

The simulation was performed under a condition in which the voltage Vdio applied to the control terminals 14-1 to 14-*n* was 1 V, and the on/off of the transistors 15-1 to 15-*n* were switched. Simulation results are shown in FIG. 3A and FIG. 3B. FIG. 3A is a graphic chart showing a relation between frequency and gain in the first simulation, and FIG. 3B is a graphic chart showing a relation between frequency and input reflection characteristic in the first simulation. Incidentally, dotted lines in FIG. 3A and FIG. 3B show results when the transistors 15-1 to 15-*n* were turned off, and solid lines show results when the transistors 15-1 to 15-*n* were turned on.

As shown in FIG. 3A, a frequency characteristic of gain is changed by switching the on/off of the transistors 15-1 to 15-*n*. Namely, the gain slope is reduced when the transistors 15-1 to 15-*n* are turned on than when they are turned off under the condition of this simulation.

Besides, as shown in FIG. 3B, the input reflection characteristic is also changed by switching the on/off of the transistors 15-1 to 15-*n*. Namely, the input reflection characteristic is improved when the transistors 15-1 to 15-*n* are turned on than when they are turned off under the condition of this simulation.

Figure 4A:
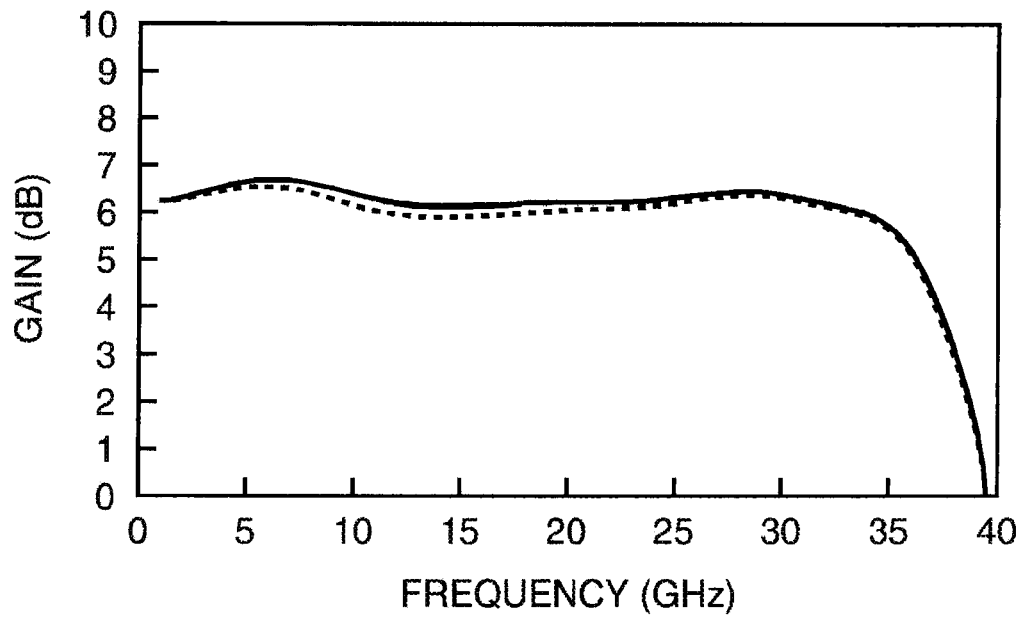
FIG. 4A is a graphic chart showing a relation between frequency and gain in a second simulation.
Figure 4B:
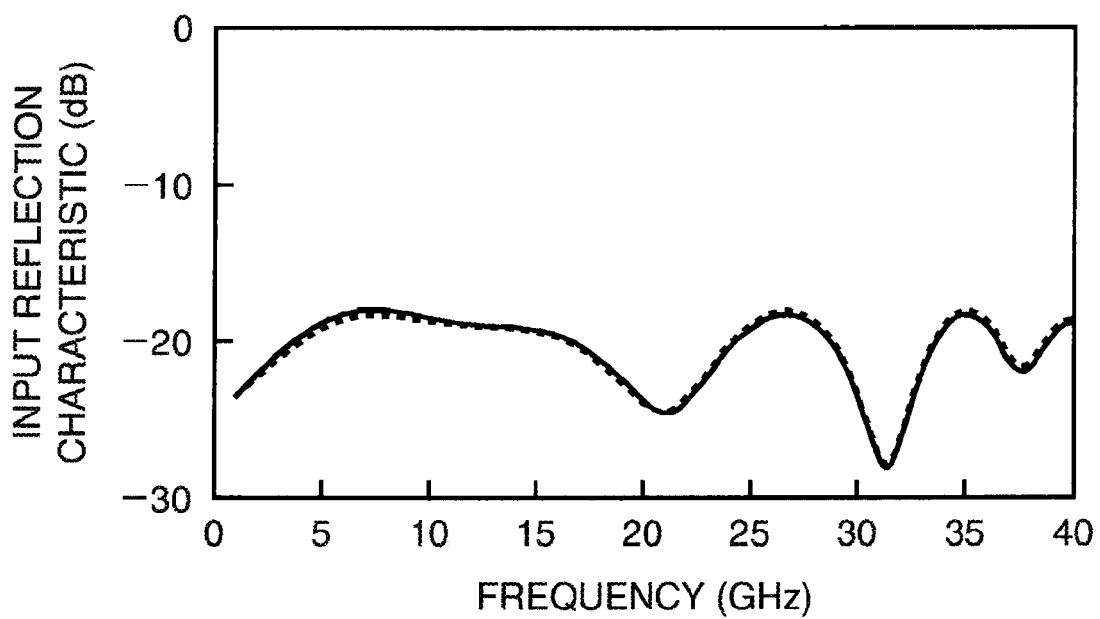
FIG. 4B is a graphic chart showing a relation between frequency and input reflection characteristic in the second simulation.

In a second simulation, the same circuit as the first simulation (FIG. 2) was an object. The simulation was performed under a condition in which the transistors 15-1 to 15-*n* were turned off, and the voltage Vdio applied to the control terminals 14-1 to 14-*n* was selected from −2 V/1 V. Simulation results are shown in FIG. 4A and FIG. 4B. FIG. 4A is a graphic chart showing a relation between frequency and gain in the second simulation, and FIG. 4B is a graphic chart showing a relation between frequency and input reflection characteristic in the second simulation. Incidentally, dotted lines in FIG. 4A and FIG. 4B show results when the voltage Vdio was −2 V, and solid lines show results when the voltage Vdio was 1 V.

As shown in FIG. 4A, the frequency characteristic of gain is changed by switching the voltage Vdio. Namely, a flatness of the gain becomes good when the voltage Vdio is 1 V than when it is −2 V under the condition of this simulation.

On the other hand, as shown in FIG. 4B, the input reflection characteristic scarcely changes when the voltage Vdio is switched.

As stated above, according to the first embodiment, it is possible to control the distributed amplifier into a state in which the expression of "$C_sR_s=C_{in}/g_m$" becomes achieved even after it is manufactured, by switching the on/off of the switch (transistor) and switching the voltage applied to the variable capacitor (variable capacitance diode), and to adjust the frequency characteristic.

Incidentally, in the above-stated simulation, the voltage Vdio is set to be two kinds, but it may be three kinds or more. Besides, it is preferable to switch all of the switches 12-1 to 12-*n* simultaneously from a point of view of a simplification of a control, and it is preferable to switch them individually from a point of view of enabling a finer control. This can also be said for the switching of the voltage Vdio.

Second Embodiment

Figure 5:
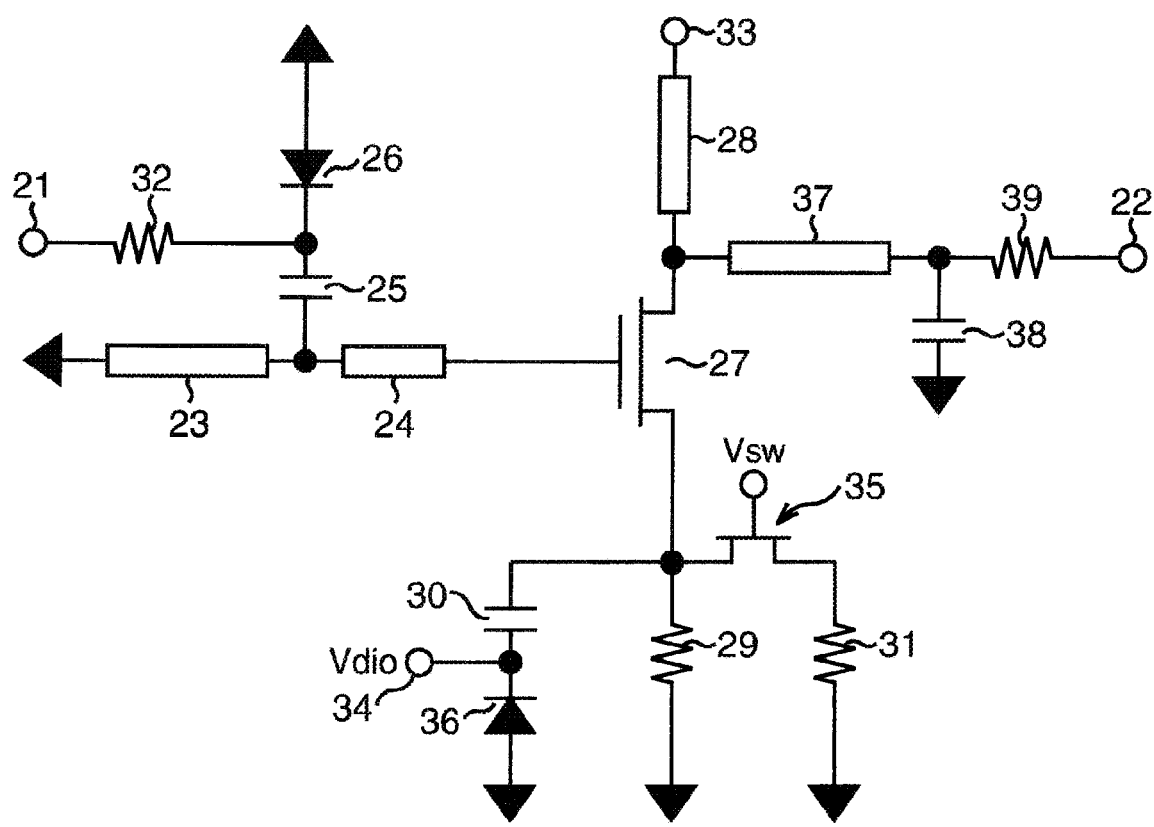
FIG. 5 is a circuit diagram showing a distributed amplifier according to a second embodiment of the present invention.

Next, a second embodiment of the present invention is described. FIG. 5 is a circuit diagram showing an oscillator according to the second embodiment of the present invention. The second embodiment is an embodiment in which a circuit similar to the input capacitance change circuit in the first embodiment is applied to the oscillator as a negative resistance change circuit, though the first embodiment relates to the distributed amplifier.

In the oscillator according to the second embodiment, a variable capacitance diode 26 and a capacitor 25 are connected in series, and an anode of the variable capacitance diode 26 is grounded. A control terminal 21 is connected to a cathode of the variable capacitance diode 26 via a resistor 32. A gate of an oscillation transistor 27 is connected to the other end of the capacitor 25. An inductor 24 exists between capacitor 25 and the gate. Besides, an inductor 23 exists between the capacitor 25 and the ground.

A capacitor 38 and a resistor 39 are connected to a drain of the oscillation transistor 27, and an output terminal 22 is connected to the other end of the resistor 39. Besides, the other end of the capacitor 38 is grounded. An inductor 37 exists between the drain, and the capacitor 38 and the resistor 39. Besides, an inductor 28 which may be constituted by a λ/4 line exists between the drain and a power voltage supply terminal 33.

A resistor 29 and a resistor 31 are connected in parallel with each other between a source of the oscillation transistor 27 and the ground. Incidentally, a transistor 35 is provided as a switch between the resistor 31 and the source. Further, a capacitor 30 and a variable capacitance diode (variable capacitor) 36 are connected in series with each other between the source and the ground. A control terminal 34 to which the voltage Vdio is applied when capacitance of the variable capacitance diode 36 is controlled is provided between the capacitor 30 and the variable capacitance diode 36. The voltage applied to the control terminal 34 may be selected from plural kinds set in advance.

In the present embodiment, a variable resistor circuit may be constituted by the resistor 29, the resistor 31, and the transistor (switch) 35, and a variable capacitor circuit may be constituted by the capacitor 30 and the variable capacitance diode 36. Further, a negative resistance change circuit may be constituted by the variable resistor circuit and the variable capacitor circuit.

In the oscillator having the constitution as stated above, for example, a frequency characteristic is measured after the transistor 35 is turned off and a constant voltage Vdio is applied to the control terminal 34 after it is manufactured. Then, when a desired oscillation frequency is not obtained, the transistor 35 is turned on, or a value of the voltage Vdio applied to the control terminal 34 is switched. As a result, value(s) of the "$C_s$" and/or "$R_s$" between the source of the oscillation transistor 27 and the ground may change, and the negative resistance changes. As a result, the oscillation frequency changes.

Here, two kinds of simulations performed by the present inventor are described. In these simulations, the voltage Vdio of −2 V or 1 V was applied to the control terminal 34.

Figure 6A:
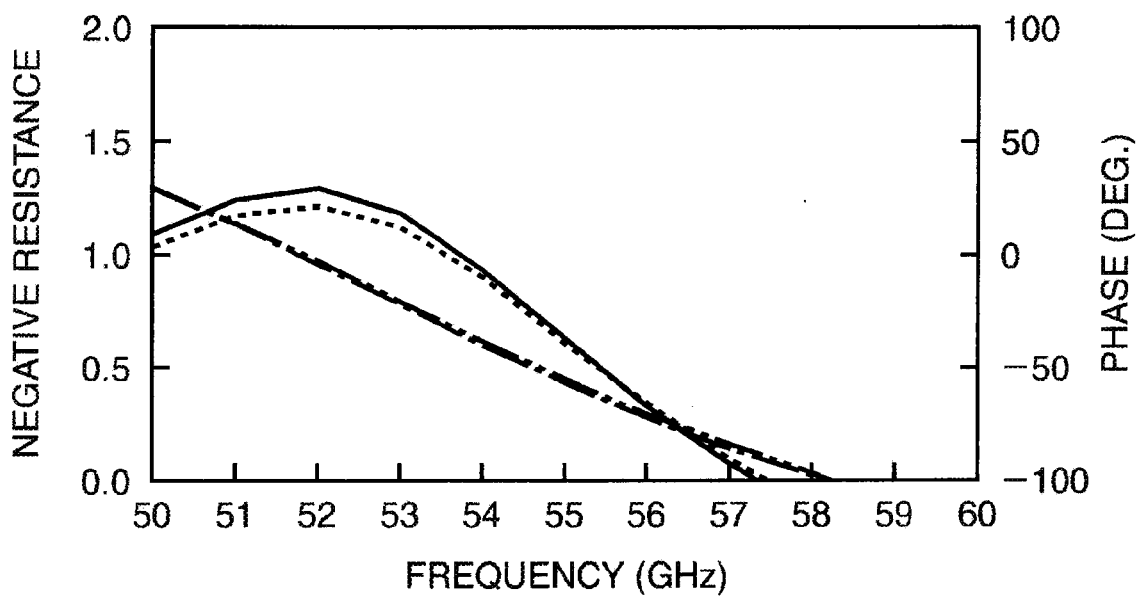
FIG. 6A is a graphic chart showing a relation between frequency, and an amount of negative resistance and phase in a third simulation.

In a third simulation, the simulation was performed under a condition in which the voltage Vdio applied to the control terminal 34 was 1 V, and the on/off of the transistor 35 was switched. Simulation results are shown in FIG. 6A. FIG. 6A is a graphic chart showing a relation between frequency, and amount of negative resistance and phase characteristic in the third simulation. Incidentally, a dotted line in FIG. 6A shows the amount of the negative resistance (left vertical axis) when the transistor 35 was turned off, a solid line shows the amount of the negative resistance when the transistor 35 was turned on, a chain line shows the phase characteristic (right vertical axis) when the transistor 35 was turned off, and a two-dot chain line shows the phase characteristic when the transistor 35 was turned on.

As shown in FIG. 6A, the amount of the negative resistance changes by switching the on/off of the transistor 35. Namely, the amount of the negative resistance increases when the transistor 35 is turned on than when it is turned off under the condition of this simulation.

Figure 6B:
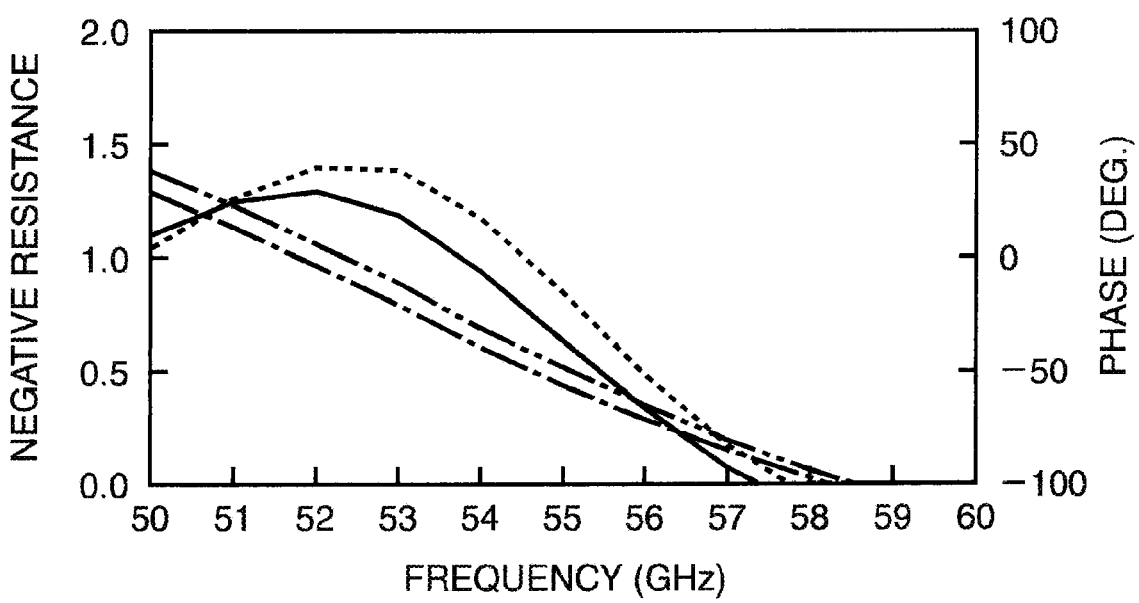
FIG. 6B is a graphic chart showing a relation between frequency, and an amount of negative resistance and phase in a fourth simulation.

Besides, in a fourth simulation, the simulation was performed under a condition in which the transistor 35 was turned off and the voltage Vdio applied to the control terminal 34 was selected from −2 V/1 V. Simulation results are shown in FIG. 6B. FIG. 6B is a graphic chart showing a relation between frequency, and amount of negative resistance and phase characteristic in the fourth simulation. Incidentally, a dotted line in FIG. 6B shows the amount of the negative resistance (left vertical axis) when the voltage Vdio was −2 V, a solid line shows the amount of the negative resistance when the voltage Vdio was 1 V, a chain line shows the phase characteristic (right vertical axis) when the voltage Vdio was −2 V, and a two-dot chain line shows the phase characteristic when the voltage Vdio was 1 V.

As shown in FIG. 6B, the amount of the negative resistance and the oscillation frequency change by switching the voltage Vdio.

As stated above, according to the second embodiment, it is possible to adjust the amount of the negative resistance. When the amount of the negative resistance is high, there is a case when an output waveform gets distorted. However, according to the second embodiment, it is possible to decrease the amount of the negative resistance when there is a possibility as stated above. Further, it is possible to improve the yield by adjusting the oscillation frequency together with a resonator series.

Third Embodiment

Figure 7:
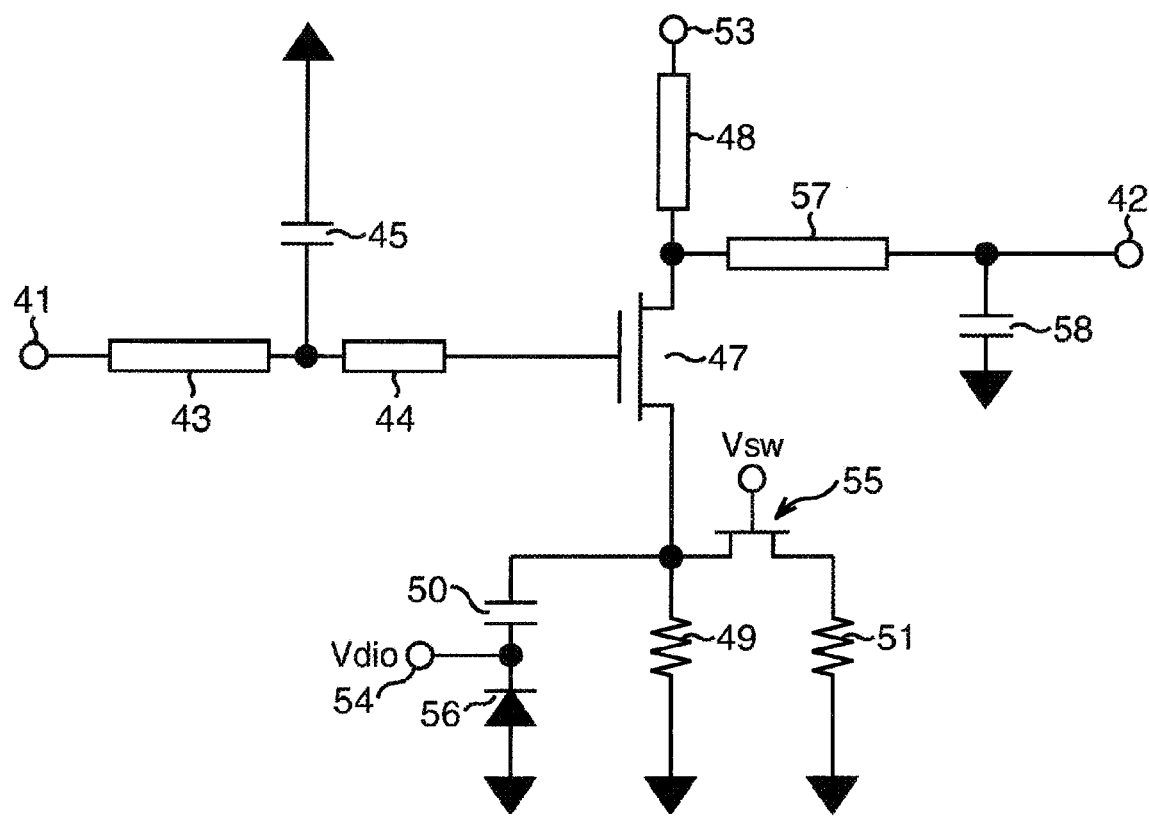
FIG. 7 is a circuit diagram showing a narrow-band amplifier according to a third embodiment of the present invention.

Next, a third embodiment of the present invention is described. FIG. 7 is a circuit diagram showing a narrow-band amplifier according to the third embodiment of the present invention. The third embodiment is an embodiment in which a main portion of the first embodiment is applied to the narrow-band amplifier, though the first embodiment relates to the distributed amplifier.

In the narrow-band amplifier according to the third embodiment, a capacitor 45 and a gate of an input transistor 47 are connected to an input terminal 41. For example, a power supply voltage is supplied to the other end of the capacitor 45. Besides, an inductor 43 exists between the input terminal 41 and the capacitor 45. Further, an inductor 44 exists between the capacitor 45 and the gate.

A capacitor 58 and an output terminal 42 are connected to a drain of the input transistor 47. Besides, the other end of the capacitor 58 is grounded. An inductor 57 exists between the drain, and the capacitor 58 and the output terminal 42. Besides, an inductor 48 which may be constituted by a λ/4 line exists between the drain and a power voltage supply terminal 53.

A resistor 49 and a resistor 51 are connected in parallel with each other between a source of the input transistor 47 and the ground. A transistor 55 is provided as a switch between the resistor 51 and the source. Further, a capacitor 50 and a variable capacitance diode (variable capacitor) 56 are connected in series with each other between the source and the ground. A control terminal 54 to which the voltage Vdio is applied when capacitance of the variable capacitance diode 56 is controlled is provided between the capacitor 50 and the variable capacitance diode 56. The voltage applied to the control terminal 54 may be selected from plural kinds set in advance.

In the present embodiment, a variable resistor circuit may be constituted by the resistor 49, the resistor 51, and the transistor (switch) 55, and a variable capacitor circuit may be constituted by the capacitor 50 and the variable capacitance diode 56. An input capacitance change circuit may be constituted by the variable resistor circuit and the variable capacitor circuit.

In the narrow-band amplifier having the constitution as stated above, a frequency characteristic is measured after, for example, the transistor 55 is turned off and a constant voltage Vdio is applied to the control terminal 54 after it is manufactured. Then, when a desired matching frequency is not obtained, the transistor 55 is turned on or a value the voltage Vdio applied to the control terminal 54 is switched. As a result, value(s) of the $C_s$ and/or $R_s$ between the source of the input transistor 47 and the ground change, and the matching frequency changes.

Here, two kinds of simulations performed by the present inventor are described. In these simulations, the voltage Vdio of −1 V or 1 V was applied to the control terminal 54.

Figure 8A:
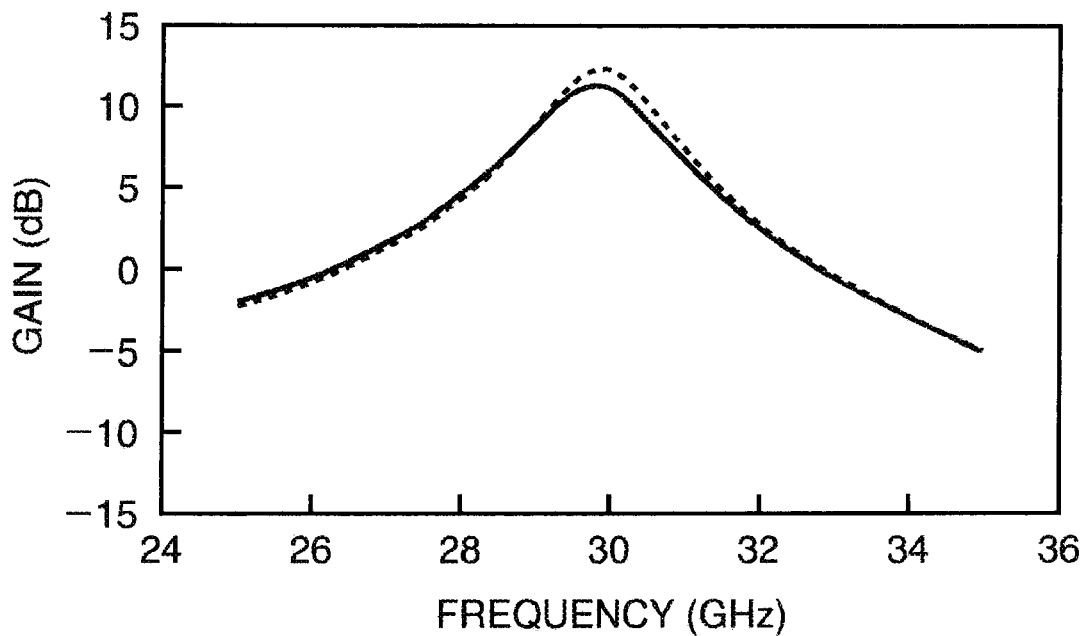
FIG. 8A is a graphic chart showing a relation between frequency and gain in a fifth simulation.
Figure 8B:
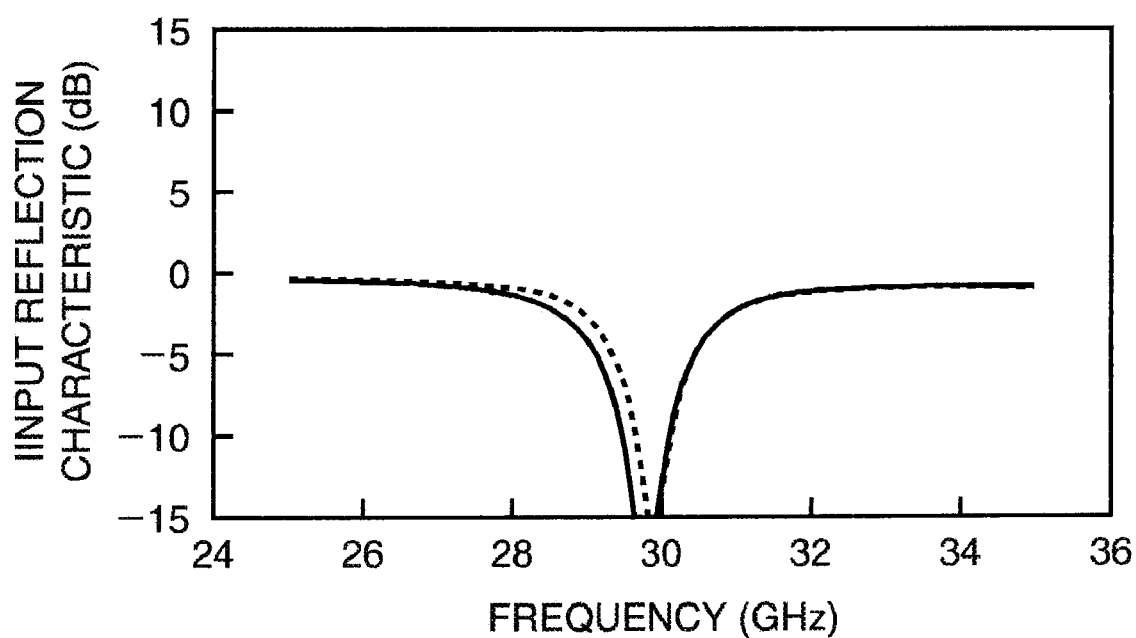
FIG. 8B is a graphic chart showing a relation between frequency and input reflection characteristic in the fifth simulation.
Figure 8C:
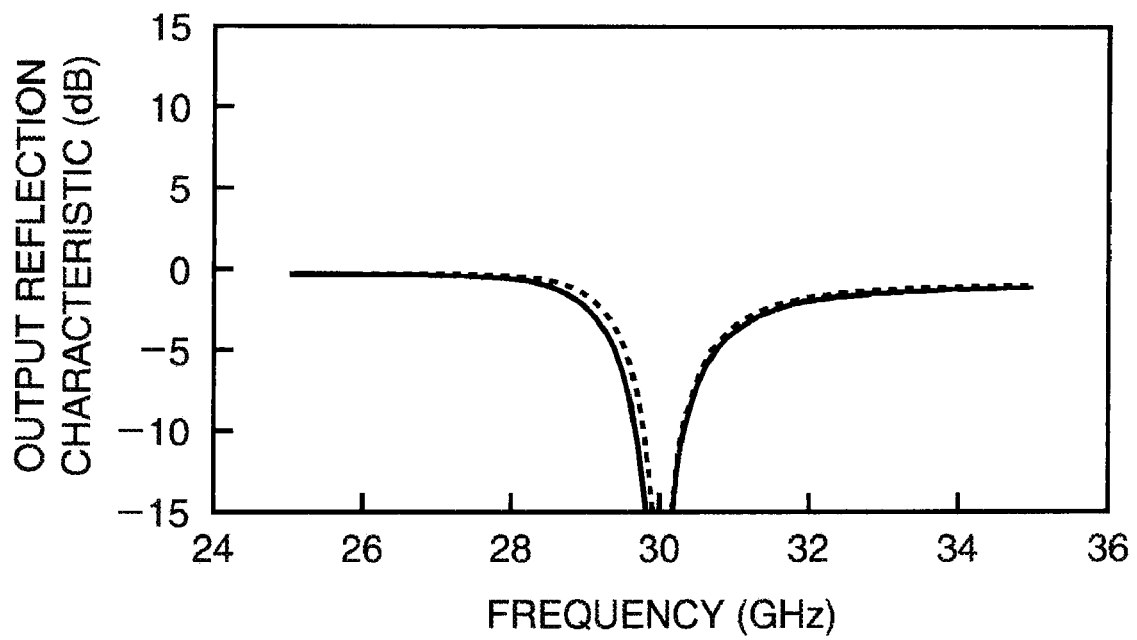
FIG. 8C is a graphic chart showing a relation between frequency and output reflection characteristic in the fifth simulation.

In a fifth simulation, the simulation is performed under a condition in which the voltage Vdio applied to the control terminal 54 was 1 V, and the on/off of the transistor 55 was switched. Simulation results are shown in FIG. 8A to FIG. 8C. FIG. 8A is a graphic chart showing a relation between frequency and gain in the fifth simulation, FIG. 8B is a graphic chart showing a relation between frequency and input reflection characteristic in the fifth simulation, and FIG. 8C is a graphic chart showing a relation between frequency and output reflection characteristic in the fifth simulation. Incidentally, dotted lines in FIG. 8A to FIG. 8C show respective results when the transistor 55 was turned off, and solid lines show respective results when the transistor 55 was turned on.

As shown in FIG. 8A, a frequency characteristic of the gain changes by switching the on/off of the transistor 55. Besides, there is no bad influence on the input reflection characteristic and the output reflection characteristic as shown in FIG. 8B and FIG. 8C.

Figure 9A:
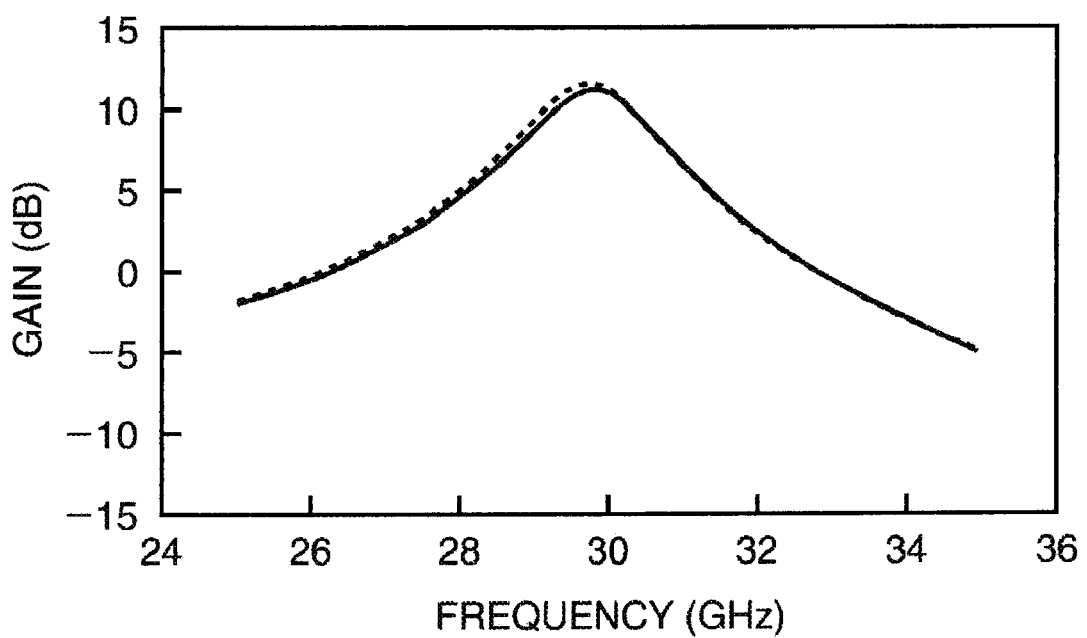
FIG. 9A is a graphic chart showing a relation between frequency and gain in a sixth simulation.
Figure 9B:
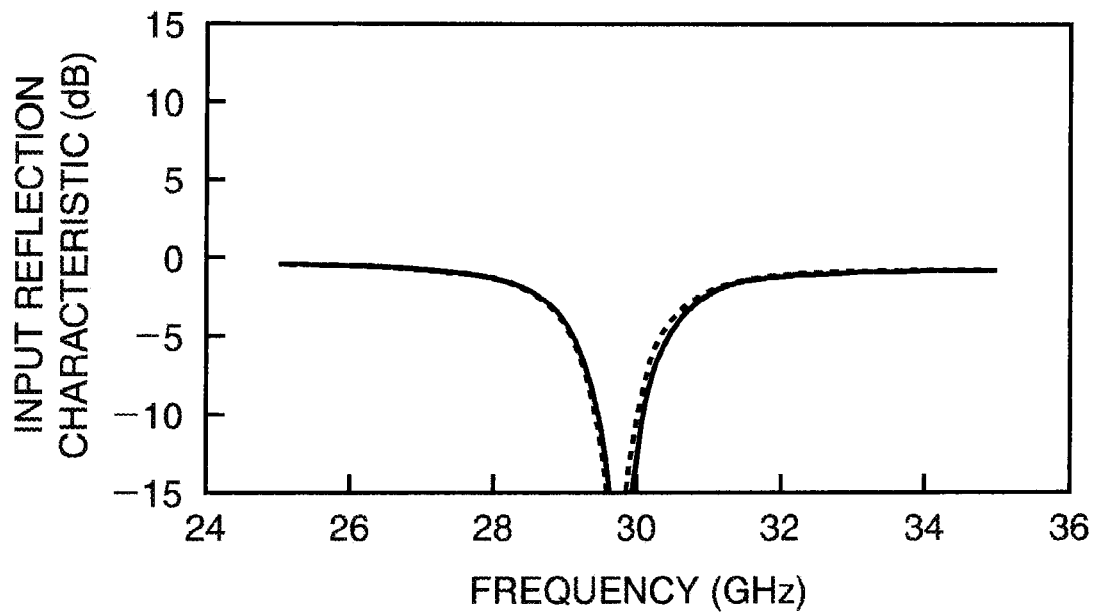
FIG. 9B is a graphic chart showing a relation between frequency and input reflection characteristic in the sixth simulation.
Figure 9C:
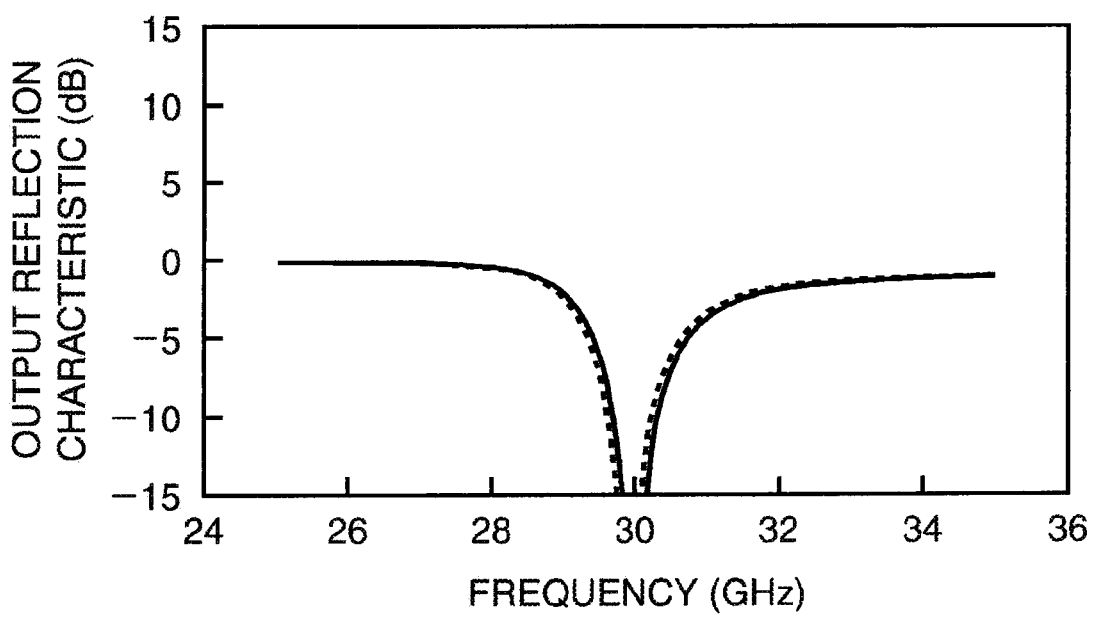
FIG. 9C is a graphic chart showing a relation between frequency and output reflection characteristic in the sixth simulation.

Besides, in a sixth simulation, the simulation was performed under a condition in which the transistor 55 was turned off, and the voltage Vdio applied to the control terminal 54 was selected from −1 V/1 V. Simulation results are shown in FIG. 9A to FIG. 9C. FIG. 9A is a graphic chart showing a relation between frequency and gain in the sixth simulation, FIG. 9B is a graphic chart showing a relation between frequency and input reflection characteristic in the sixth simulation, and FIG. 9C is a graphic chart showing a relation between the frequency and output reflection characteristic in the sixth simulation. Incidentally, dotted lines in FIG. 9A to FIG. 9C show respective results when the voltage Vdio was −1 V, and solid lines show respective results when the voltage Vdio was 1 V.

As shown in FIG. 9A, a frequency characteristic of the gain changes by switching the voltage Vdio. Besides, there is no bad influence on the input reflection characteristic and the output reflection characteristic as shown in FIG. 9B and FIG. 9C.

As stated above, according to the third embodiment, the control of the gain and the adjustment of the matching frequency are possible. The matching frequency is easy to vary resulting from the manufacturing environment of the transistor and so on, and therefore, the present embodiment is particularly effective in the case as stated above.

Fourth Embodiment

Figure 10:
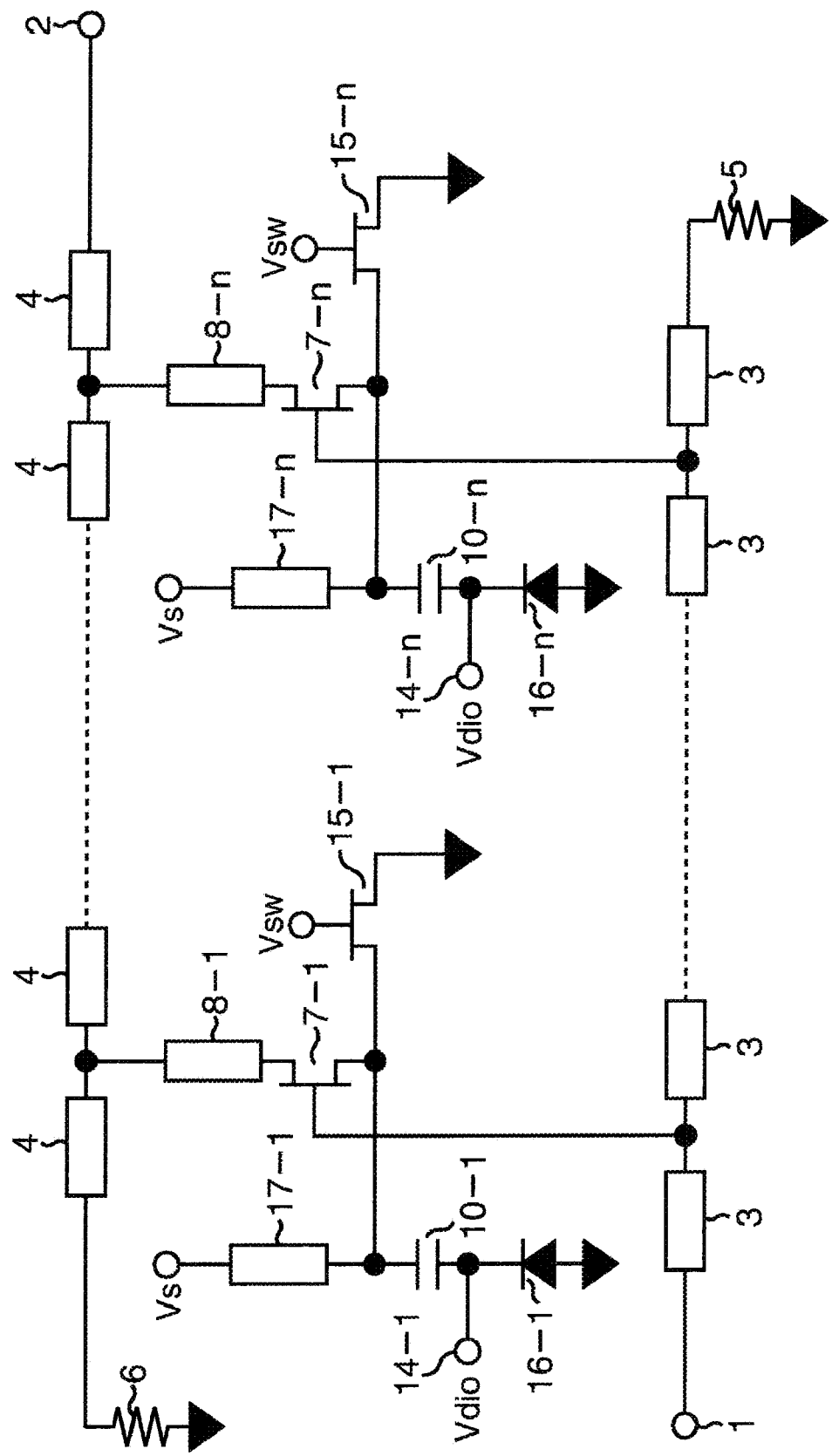
FIG. 10 is a circuit diagram showing a distributed amplifier according to a fourth embodiment of the present invention.
Figure 11:
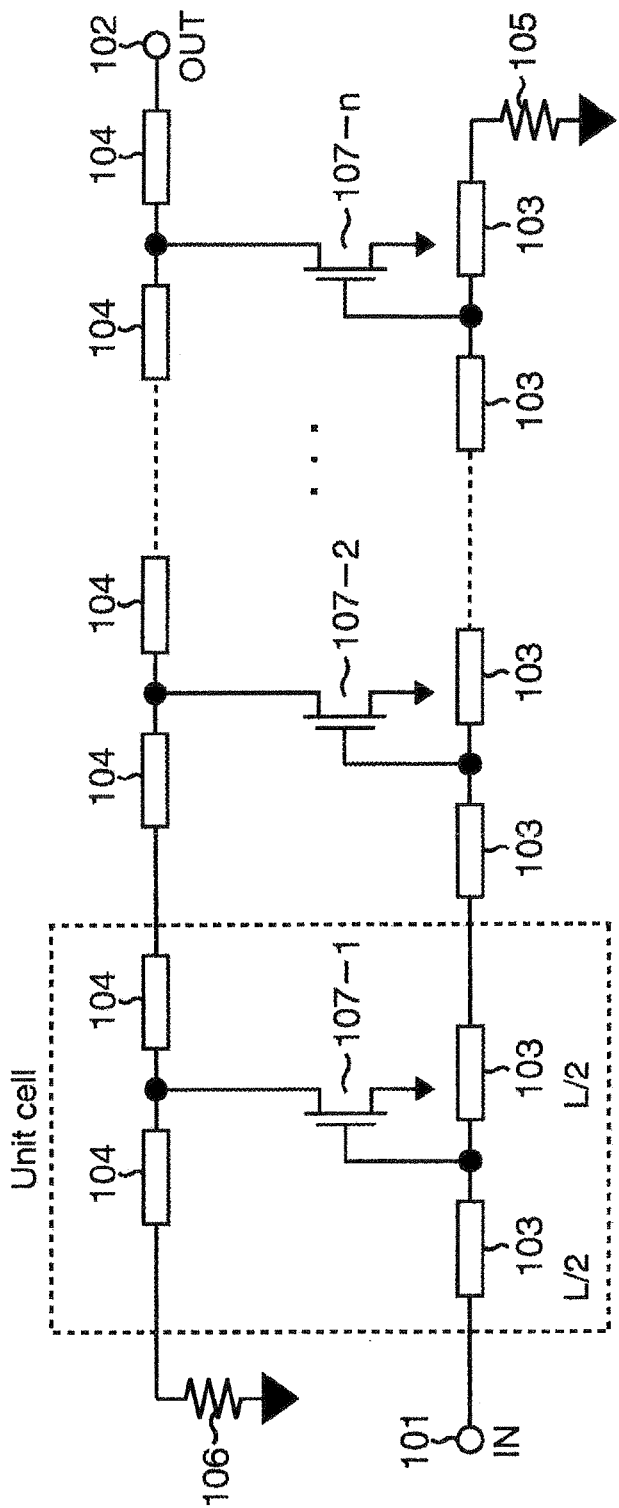
FIG. 11 is a circuit diagram showing a configuration of a conventional distributed amplifier.
Figure 12:
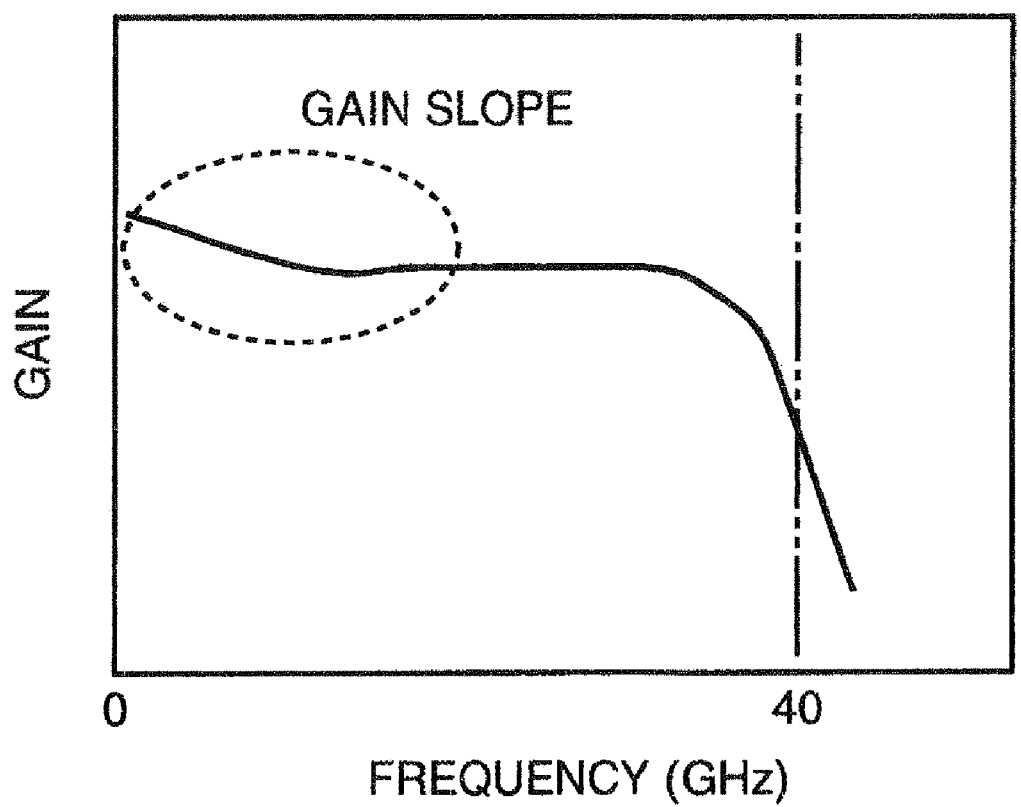
FIG. 12 is a graphic chart showing a frequency characteristic of the conventional distributed amplifier.
Figure 13A:
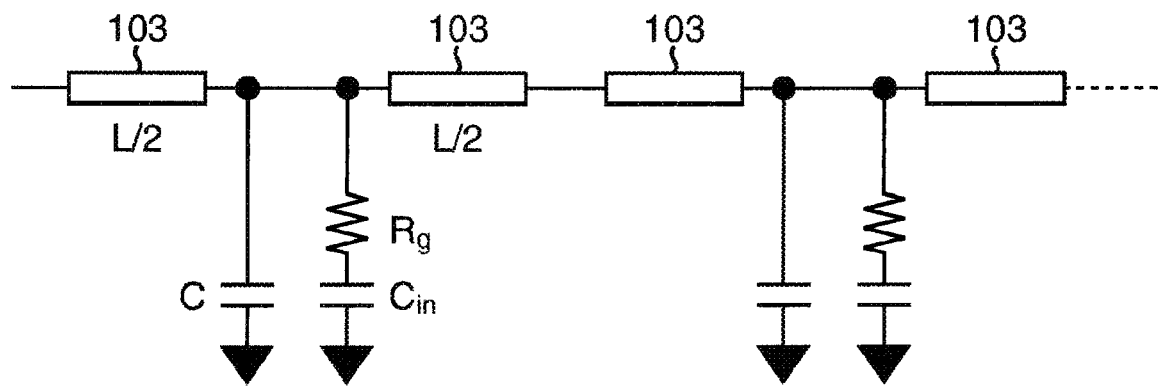
FIG. 13A is an equivalent circuit diagram at an input transmission line side of each input transistor.
Figure 13B:
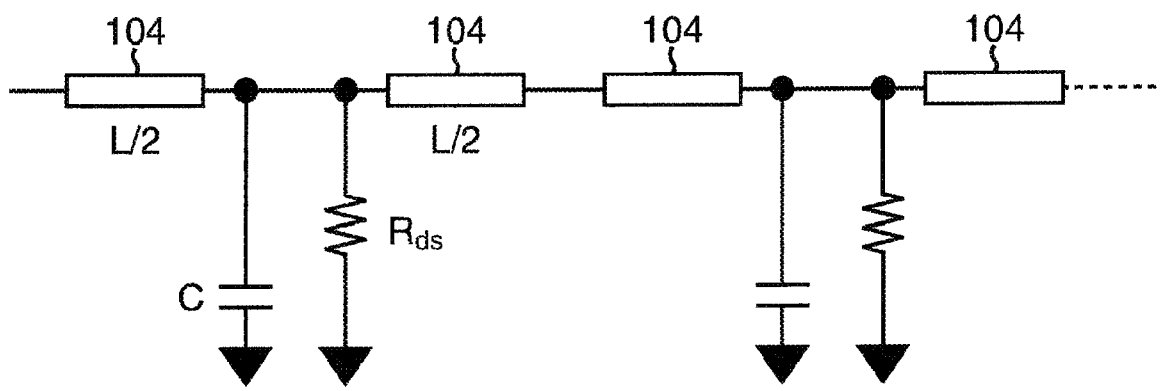
FIG. 13B is an equivalent circuit diagram at an output transmission line side of each input transistor.
Figure 14:
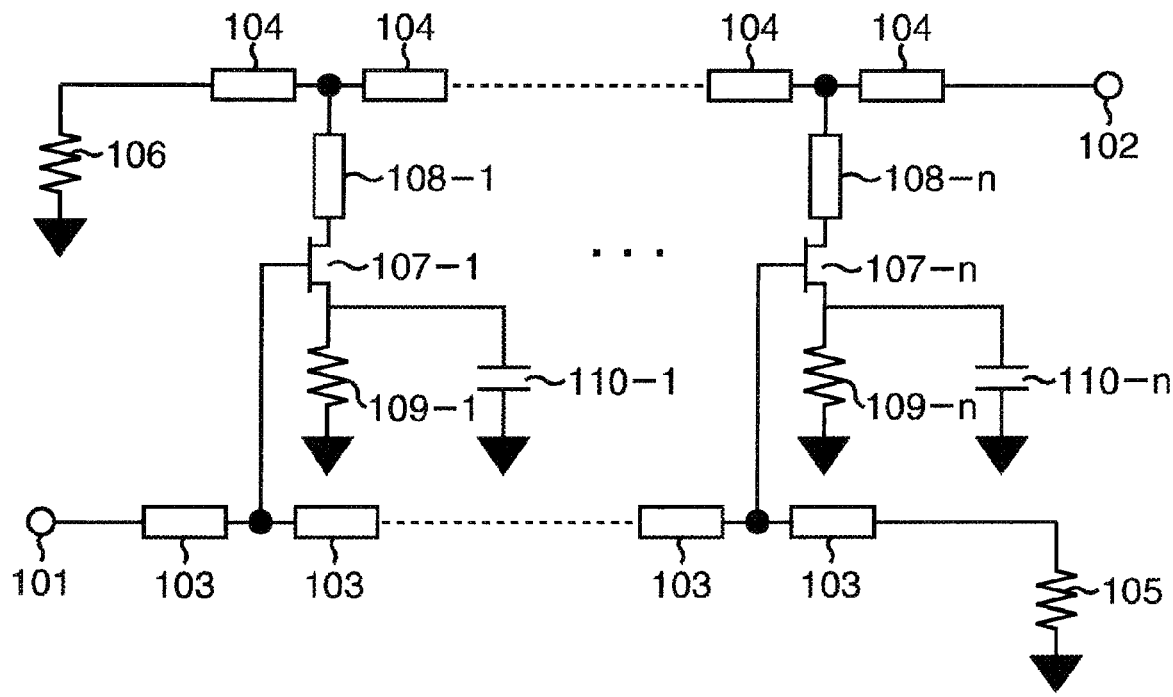
FIG. 14 is a circuit diagram showing a Capacitive Source Degeneration circuit.
Figure 15:
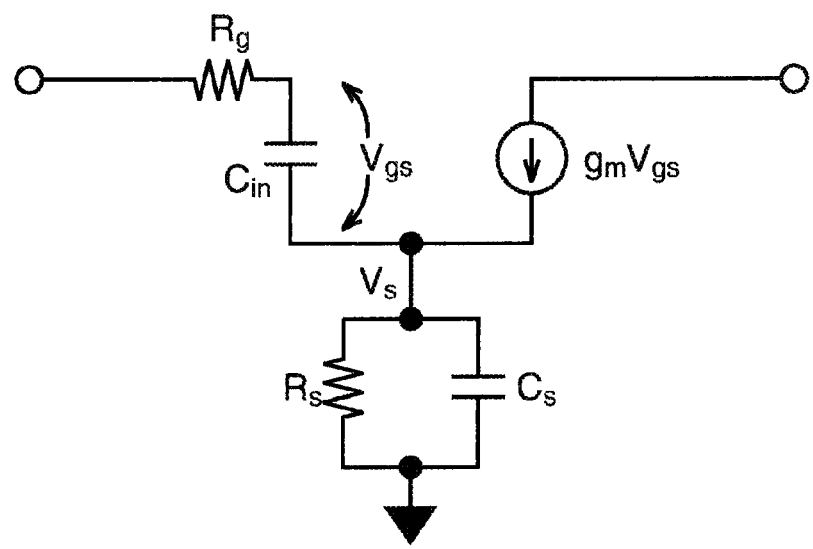
FIG. 15 is a view showing a principle of the Capacitive Source Degeneration circuit.

Next, a fourth embodiment of the present invention is described. FIG. 10 is a circuit diagram showing a distributed amplifier according to the fourth embodiment of the present invention.

As shown in FIG. 10, in the forth embodiment, the resistors 9-1 to 9-n are not connected to the sources of the input transistors 7-1 to 7-n, but inductors 17-1 to 17-n which may be constituted by choke coils or ¼λ lines are connected thereto.

In the fourth embodiment as stated above, it is possible to suppress manufacturing variations by switching the on/off of the transistors 15-1 to 15-n as same as the first embodiment.

Incidentally, in the first to fourth embodiments, a field-effect transistor is used as the transistor, but a bipolar junction transistor may be used instead thereof.

Besides, it is not necessary to provide both of the variable resistor circuit and the variable capacitor circuit for the input capacitance change circuit and the negative resistance change circuit, and an object of the present invention can be attained by providing either one of them.

Besides, the numbers of the switches, resistor elements, variable capacitor elements, and so on provided at the input capacitance change circuit and the negative resistance change circuit are not limited. There is a possibility in which a circuitry, a control, and so on become complicated by using the more numbers of the above, but it becomes possible to perform finer control, adjustment, and so on.

Incidentally, the configuration of the distributed amplifier is not limited to the one shown in FIG. 1 and so on, but for example, it is possible to apply for a differential amplifier, an amplifier to which plural input transistors are cascaded, and so on.

Besides, semiconductor materials composing these circuits are not limited in particular, and for example, a GaAs series compound semiconductor, an InP series compound semiconductor, a GaN series compound semiconductor, an Si series semiconductor and so on can be used.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

INDUSTRIAL APPLICABILITY

According to the present invention, it is possible to adjust input capacitance of an input transistor by an input capacitance change circuit, and therefore, it is possible to correct a problem even if the problem such as a gain slope occurs after it is manufactured. Besides, in the invention relating to an oscillator, it is possible to adjust an oscillation frequency by adjusting negative resistance.

What is claimed is:

1. An analog circuit, comprising:
   an input transistor; and
   an input capacitance change circuit changing input capacitance of said input transistor, and functioning as a distributed amplifier, and connected to a source of said input transistor,
   wherein a gate of said input transistor is directly connected to an input transmission line.

2. The analog circuit according to claim 1,
   wherein a plurality of said input transistors and input capacitance change circuits are provided, and
   wherein one of said input capacitance change circuits is provided for one of said input transistors.

3. An analog circuit, comprising:
   an input transistor; and
   an input capacitance change circuit changing input capacitance of said input transistor,
   wherein said input capacitance change circuit comprises at least one of a variable resistor circuit connected to a source of said input transistor and a variable capacitor circuit connected to the source of said input transistor.

4. An analog circuit, comprising:
   an input transistor; and
   an input capacitance change circuit changing input capacitance of said input transistor, and functioning as a distributed amplifier, and connected to a source of said input transistor,
   wherein said input capacitance change circuit comprises a variable resistor circuit connected to a source of said input transistor.

5. The analog circuit according to claim 4, wherein the variable resistor circuit comprises:
   a first resistor element connected to the source; and
   a second resistor element connected to the source via a switch.

6. An analog circuit, comprising:
   an input transistor; and
   an input capacitance change circuit changing input capacitance of said input transistor, and functioning as a distributed amplifier, and connected to a source of said input transistor,
   wherein said input capacitance change circuit has a variable capacitor circuit connected to a source of said input transistor.

7. The analog circuit according to claim 6, wherein the variable capacitor circuit comprises:
   a capacitor element connected to the source; and
   a variable capacitor element connected to the capacitor element.

8. The analog circuit according to claim 4, wherein said input capacitance change circuit comprises a variable capacitor circuit connected to the source of said input transistor.

9. The analog circuit according to claim 8, wherein the variable capacitor circuit comprises:

a capacitor element connected to the source; and a variable capacitor element connected to the capacitor element.

10. An analog circuit, comprising:

an input transistor; and an input capacitance change circuit changing input capacitance of said input transistor, and functioning as a distributed amplifier, and connected to a source of said input transistor, wherein a plurality of said input transistors and input capacitance change circuits are provided, wherein one of said input capacitance change circuit is provided for one of said input transistor, and wherein each of said input capacitance change circuits comprises:

a first resistor element connected to a source of said input transistor; and a second resistor element connected to the source via a switch.

11. The analog circuit according to claim 10, wherein the switches provided at said respective input capacitance change circuits are independently controlled from one another.

12. The analog circuit according to claim 10, wherein the switches provided at said respective input capacitance change circuits are collectively controlled with each other.

13. An analog circuit, comprising:

an input transistor; and an input capacitance change circuit changing input capacitance of said input transistor, and functioning as a distributed amplifier, and connected to a source of said input transistor, wherein a plurality of said input transistors and input capacitance change circuits are provided, wherein one of said input capacitance change circuits is provided for one of said input transistors, and wherein each of said input capacitance change circuits comprises:

a capacitor element connected to a source of said input transistor; and a variable capacitor element connected to the capacitor element.

14. The analog circuit according to claim 13, wherein capacitance values of the respective variable capacitor elements are independently controlled from one another.

15. The analog circuit according to claim 13, wherein capacitance values of the respective variable capacitor elements are collectively controlled with each other.

16. The analog circuit according to claim 10, wherein a plurality of said input transistors and input capacitance change circuits are provided, wherein one of said input capacitance change circuits is provided for one of said input transistors, and wherein each of said input capacitance change circuits comprises:

a capacitor element connected to a source of said input transistor; and a variable capacitor element connected to the capacitor element.

* * * * *